(12) United States Patent
Yoon et al.

(10) Patent No.: US 12,276,939 B2
(45) Date of Patent: Apr. 15, 2025

(54) HOLOGRAPHIC IMAGE SENSOR

(71) Applicant: KOREA PHOTONICS TECHNOLOGY INSTITUTE, Gwangju (KR)

(72) Inventors: Seon Kyu Yoon, Gwangju (KR); Jin Su Lee, Gwangju (KR)

(73) Assignee: KOREA PHOTONICS TECHNOLOGY INSTITUTE, Gwangju (KR)

( * ) Notice: Subject to any disclaimer, the term of this patent is extended or adjusted under 35 U.S.C. 154(b) by 480 days.

(21) Appl. No.: 17/744,628

(22) Filed: May 14, 2022

(65) Prior Publication Data
US 2023/0213889 A1     Jul. 6, 2023

(30) Foreign Application Priority Data
Dec. 30, 2021 (KR) .................. 10-2021-0192124

(51) Int. Cl.
| | |
|---|---|
| *G03H 1/04* | (2006.01) |
| *G01J 1/42* | (2006.01) |
| *G01J 9/02* | (2006.01) |
| *H04N 23/55* | (2023.01) |

(Continued)

(52) U.S. Cl.
CPC .............. *G03H 1/0402* (2013.01); *G01J 1/42* (2013.01); *G01J 9/02* (2013.01); *G03H 1/0443* (2013.01); *H04N 23/55* (2023.01); *H04N 23/56* (2023.01); *H10F 39/12* (2025.01); *G03H 2001/0428* (2013.01); *G03H 2001/0452* (2013.01)

(58) Field of Classification Search
CPC . G01J 1/42; G03H 1/0443; G03H 2001/0428; G03H 2222/34; G03H 2222/42; G03H 2001/0452; G03H 2001/0445; G03H 2001/0447; G03H 2226/11; G03H 2223/19; G03H 1/04; H01L 27/146; H10F 39/12

See application file for complete search history.

(56) References Cited

U.S. PATENT DOCUMENTS

2005/0168749 A1*   8/2005   Ye .................. G03H 1/0005
                                                                 356/458
2007/0228421 A1   10/2007   Shioya et al.
(Continued)

FOREIGN PATENT DOCUMENTS

| JP | 2007-184566 A | | 7/2007 |
|---|---|---|---|
| JP | 2020095228 A | * | 6/2020 |

OTHER PUBLICATIONS

English Specification of JP2020-095228A.
English Specification of JP2007-184566A.

*Primary Examiner* — Thanh Luu
*Assistant Examiner* — Mai Thi Ngoc Tran
(74) *Attorney, Agent, or Firm* — Dinsmore & Shohl LLP; Yongsok Choi, Esq.

(57) ABSTRACT

According to an embodiment, a holographic image sensor comprises a lens focusing object light incident from outside of the holographic image sensor to the holographic image sensor, a filter transmitting a predetermined wavelength band of light of the focused object light, a light receiving unit receiving interference light to sense a holographic image, and a reference light source directly emitting reference light having the predetermined wavelength band to the light receiving unit.

8 Claims, 5 Drawing Sheets

(51) Int. Cl.
*H04N 23/56* (2023.01)
*H10F 39/12* (2025.01)

(56) References Cited

U.S. PATENT DOCUMENTS

| | | | |
|---|---|---|---|
| 2008/0116465 A1* | 5/2008 | Moon | H01L 33/0004 |
| | | | 257/E33.044 |
| 2017/0167929 A1 | 6/2017 | Ellis et al. | |
| 2023/0213890 A1* | 7/2023 | Yoon | G03H 1/0443 |
| | | | 359/9 |

* cited by examiner

HOLOGRAPHIC IMAGE SENSOR

CROSS-REFERENCE TO RELATED APPLICATION

This application is based on and claims priority under 35 U.S.C. 119 to Korean Patent Application No. 10-2021-0192124, filed on Dec. 30, 2021, in the Korean Intellectual Property Office, the disclosure of which is herein incorporated by reference in its entirety.

TECHNICAL FIELD

Embodiments of the disclosure relate to sensors capable of sensing holographic images.

DESCRIPTION OF RELATED ART

The description of the Discussion of Related Art section merely provides information that may be relevant to embodiments of the disclosure but should not be appreciated as necessarily constituting the prior art.

Conventionally, in measuring visible light, only width information about the light may be measured. This is why, unlike sounds or radio waves, visible light has the frequency exceeding the maximum frequency measurable by an electronic device. The lost phase information contains information about the position or depth of the object. Accordingly, photo information obtained by measuring the width information alone may not provide a three-dimensional (3D) effect.

To address such issue, holography has been developed. Holography is technology for measuring the whole optical field by simultaneously measuring the phase and amplitude of light and collectively refers to techniques that measure phase information about light, store and display images with a 3D effect. The object light (also referred to as the object beam) of holography restores or reconstructs information using the interference fringe of the reference light (or also referred to as the reference beam) whose information is known. As such, to sense a holographic image using an interference fringe, conventional sensors have an optical structure as shown in FIG. 5.

FIG. 5 is a view illustrating a holographic image sensor according to the prior art.

Referring to FIG. 5, light incident on the image sensor is split into a first beam and a second beam by a beam splitter 510. The first beam passes through the beam splitter 510 and a beam splitter 540 to a light receiving unit 550. The second beam is split by the beam splitter 510 and passes through a first mirror 520 and a second mirror 530, and is reflected by the beam splitter 540 to the light receiving unit 550. As such, while propagating in different paths, one beam serves as the object beam, and the other as the reference beam, causing interference.

Such conventional holographic image sensors require various optical structures to induce interference between the object beam and the reference beam and are difficult to lighten or downsize.

SUMMARY

According to an embodiment, there is provided a lightweight, downsize or compact holographic image sensor.

According to an embodiment, a holographic image sensor comprises a lens focusing object light incident from outside of the holographic image sensor to the holographic image sensor, a filter transmitting a predetermined wavelength band of light of the focused object light, a light receiving unit receiving interference light to sense a holographic image, and a reference light source directly emitting reference light having the predetermined wavelength band to the light receiving unit.

The light receiving unit may include a photodiode.

The holographic image sensor may further comprise a barrier rib preventing other light than the object light and the reference light from being incident on the holographic image sensor.

The barrier rib may be placed within a predetermined range from the light receiving unit.

The reference light source may be attached, in a position, to the barrier rib.

The reference light source may include a nano wire transistor.

According to an embodiment, a holographic image sensor comprises a lens focusing object light incident from outside of the holographic image sensor to the holographic image sensor, a reflective coating formed on an inner surface of the lens, a filter transmitting a predetermined wavelength band of light of the focused object light, a light receiving unit receiving interference light to sense a holographic image, and a reference light source emitting reference light having the predetermined wavelength band to the lens.

The reference light source may emit the reference light to the lens. The reference light may be reflected by the reflective coating to the light receiving unit.

The holographic image sensor may further comprise a barrier rib preventing other light than the object light and the reference light from being incident on the holographic image sensor.

The barrier rib may be placed within a predetermined range from the light receiving unit.

The reference light source may include a nano wire transistor.

The light receiving unit may include a photodiode.

According to embodiments of the disclosure, it is possible to provide a small, compact, lightweight holographic image sensor.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Various changes may be made to the present invention, and the present invention may come with a diversity of embodiments. Some embodiments of the present invention are shown and described in connection with the drawings. However, it should be appreciated that the present disclosure is not limited to the embodiments, and all changes and/or equivalents or replacements thereto also belong to the scope of the present disclosure. Similar reference denotations are used to refer to similar elements throughout the drawings.

The terms "first" and "second" may be used to describe various components, but the components should not be limited by the terms. The terms are used to distinguish one component from another. For example, a first component may be denoted a second component, and vice versa without departing from the scope of the present disclosure. The term "and/or" may denote a combination(s) of a plurality of related items as listed or any of the items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when a component is "directly connected to" or "directly coupled to" another component, no other intervening components may intervene therebetween.

The terms as used herein are provided merely to describe some embodiments thereof, but not to limit the present disclosure. As used herein, the singular forms "a," "an," and "the" are intended to include the plural forms as well, unless the context clearly indicates otherwise. As used herein, the term "comprise," "include," or "have" should be appreciated not to preclude the presence or addability of features, numbers, steps, operations, components, parts, or combinations thereof as set forth herein.

Unless otherwise defined, all terms including technical and scientific terms used herein have the same meaning as commonly understood by one of ordinary skill in the art to which the embodiments of the present disclosure belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The components, processes, steps, or methods according to embodiments of the disclosure may be shared as long as they do not technically conflict with each other.

Figure 1:
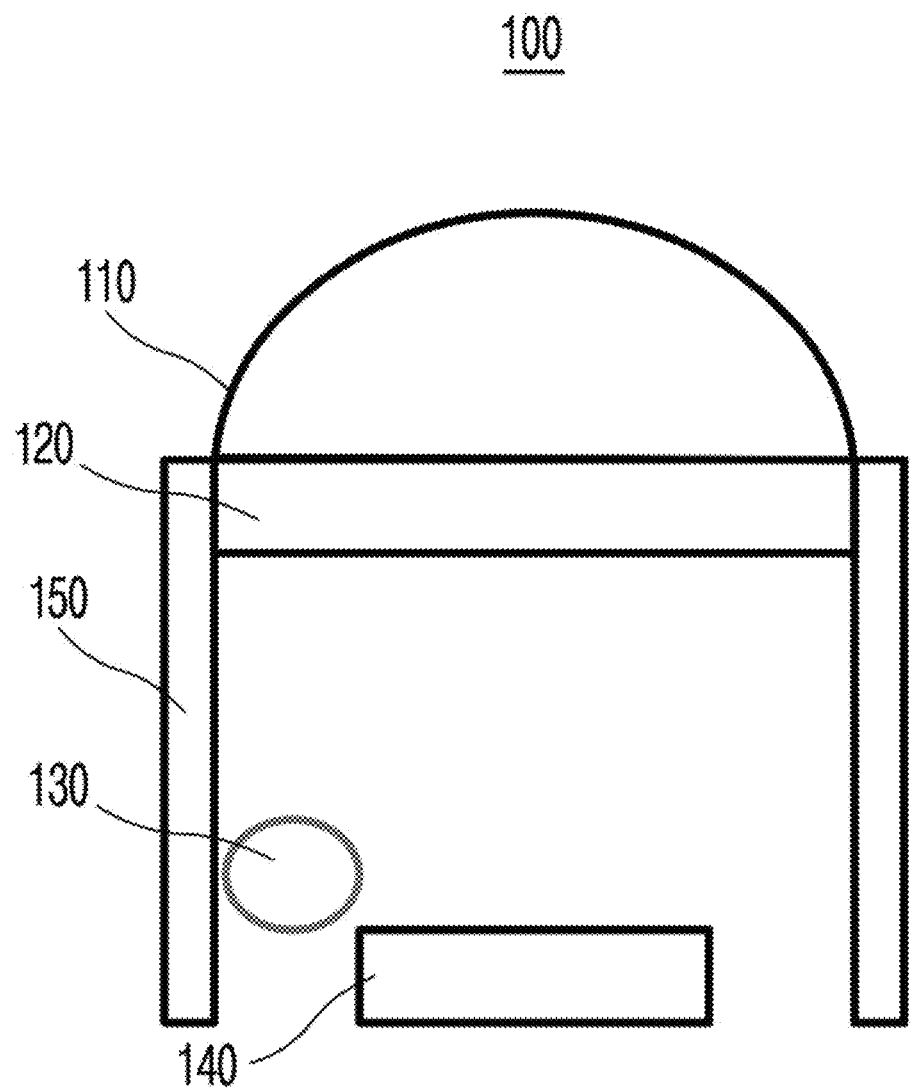
FIG. 1 is a cross-sectional view illustrating a configuration of a holographic image sensor according to an embodiment.
Figure 2:
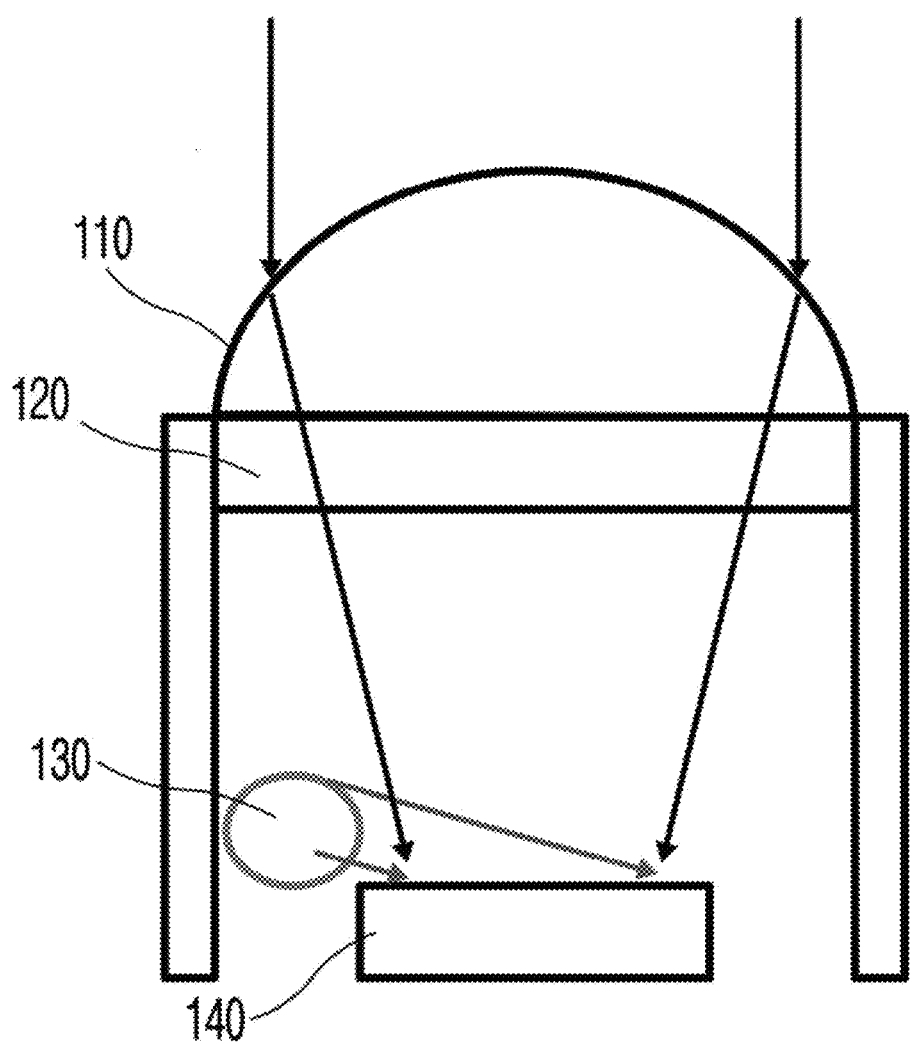
FIG. 2 is a view illustrating an operation of a holographic image sensor according to an embodiment.

FIG. 1 is a cross-sectional view illustrating a configuration of a holographic image sensor according to an embodiment. FIG. 2 is a view illustrating an operation of a holographic image sensor according to an embodiment.

Referring to FIGS. 1 and 2, according to an embodiment, a holographic image sensor 100 (simply referred to as a 'sensor') may include a lens 110, a filter 120, a reference light source 130, a light receiving unit 140, and a barrier rib 150.

The sensor 100 is a device or element that digitalizes hologram information and stores it. The sensor 100 constitutes one pixel unit and senses and stores a point hologram. Unlike in the conventional art, the sensor 100 may have a form factor that has been significantly lightened and downsized, without the need for various optical structures for sensing hologram information.

The object light (also referred to as the object beam), which is incident from the outside to the sensor 100, is focused on the light receiving unit 140 by the lens 110. The lens 110 may be a convex lens. The lens 110 is positioned on a front end of the filter 120 to receive the incident object light and focuses the object light to the light receiving unit 140.

The filter 120 filters the object light entering through the lens 110 and transmits only a predetermined wavelength band of light, of the object light. The filter 120 filters out the other wavelength bands of light than the predetermined wavelength band of light, allowing the object light in the sensor 100 to have a predetermined wavelength.

The reference light source 130 is attached, in one position, to the barrier rib 150, to directly emit a predetermined wavelength band of light (e.g., reference light) to the light receiving unit 140. The reference light source 130 directly emits the reference light to the light receiving unit 140 without a separate optical structure. The reference light source 130 may be implemented as a nano wire transistor. The reference light source 130 has a different optical axis from that the object light coming through the lens 110 and the filter 120 to the light receiving unit 140. As the reference light source 130 directly emits the reference light to the light receiving unit 140, the light receiving unit 140 may sense the object, as a holographic image. In particular, since only the predetermined wavelength band of object light filtered by the filter 120 is incident on the light receiving unit 140, the reference light source 130 emits the predetermined wavelength band of reference light, causing coherence with the object light.

The light receiving unit 140 may be implemented as a light sensing device or element, e.g., a photodiode, and receive the interference light and sense a holographic image. By passing through the filter 120, the object light may be interfered with the reference light from the reference light source 130 and is incident on the light receiving unit 140. Thus, the light receiving unit 140 may sense the holographic image for the object.

The barrier rib 150 supports the reference light source 130 and prevents light interference between sensors 100. As described above, as the sensor 100 constitutes one pixel unit, a plurality of sensors 100 may be arrayed. Such an occasion may occur where the reference light from one sensor is directed to the adjacent sensor. To prevent such an occasion, the barrier rib 150 is disposed adjacent to the light receiving unit 140. The barrier rib 150 blocks other light, which may come from the outside to the light receiving unit 140, than the above-described object light and reference light, preventing other light than the object light and the reference light from being incident on the light receiving unit 140.

As the sensor 100 is so structured, it is possible to secure coherence for the object light even without a separate optical system. Accordingly, the sensor 100 may have a significantly lightened, downsized form factor.

Figure 3:
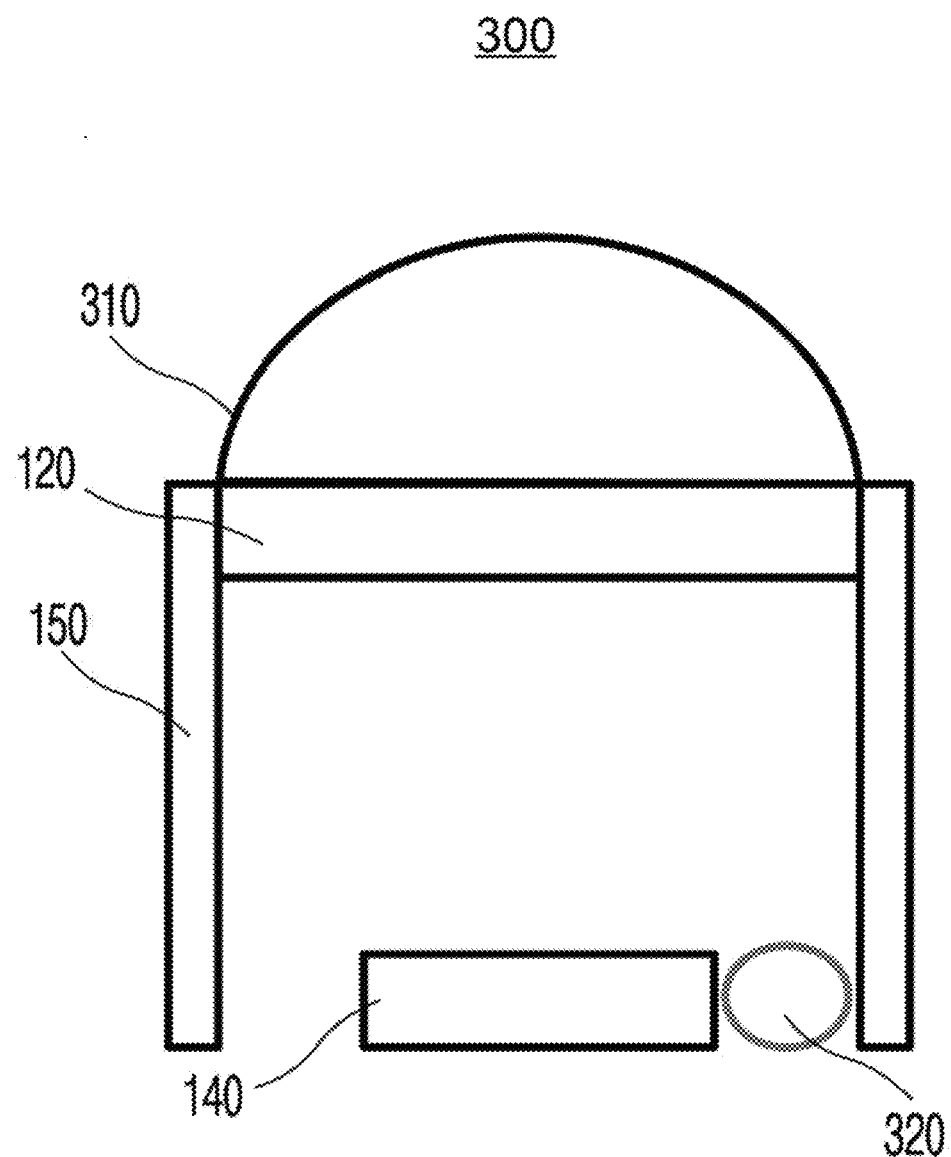
FIG. 3 is a cross-sectional view illustrating a configuration of a holographic image sensor according to an embodiment.
Figure 4:
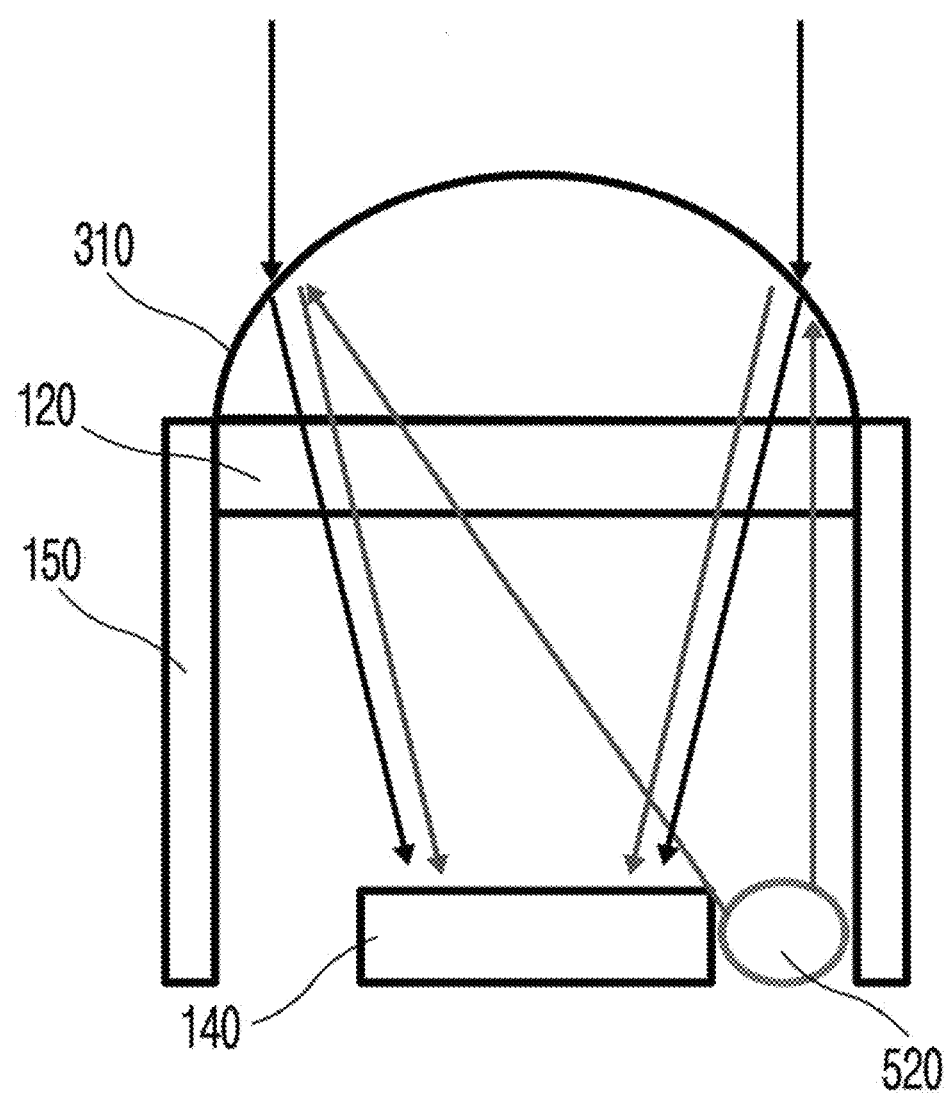
FIG. 4 is a view illustrating an operation of a holographic image sensor according to an embodiment.
Figure 5:
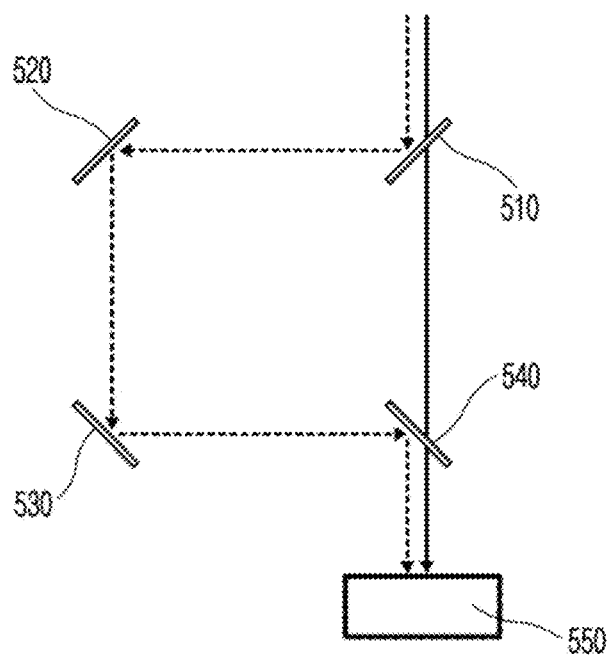
FIG. 5 is a view illustrating a holographic image sensor according to the prior art.

FIG. 3 is a cross-sectional view illustrating a configuration of a holographic image sensor according to an embodiment. FIG. 4 is a view illustrating an operation of a holographic image sensor according to an embodiment.

Referring to FIGS. 3 and 4, according to an embodiment, a holographic image sensor 300 (simply referred to as a 'sensor') may include a lens 310, a filter 120, a reference light source 320, a light receiving unit 140, and a barrier rib 150.

The filter 120, the light receiving unit 140, and the barrier rib 150 may be substantially identical in configuration, structure, function, or operation to the filter 120, the light receiving unit 140, and the barrier rib 150 described above in connection with FIGS. 1 and 2.

The lens 310 may perform substantially the same operation as the lens 110. However, unlike the lens 110, the lens 310 includes a reflective coating (not shown) on an inner surface thereof, e.g., the inner surface facing the filter 120. Thus, the lens 110 focuses the object light incident from outside, to the light receiving unit 140 and reflects the reference light from the reference light source 320 to, e.g., the light receiving unit 140. Since the lens 310 is shaped to be able to focus the object light incident from the outside, to the light receiving unit 140, the lens 110 reflects the reference light from the reference light source 320 to be focused to the light receiving unit 140.

The reference light source 130 emits the reference light to the lens 310. Unlike the reference light source 130, the reference light source 320 emits the reference light to the lens 310, rather than directly emitting the reference light to the light receiving unit 140. The emitted reference light is reflected by the lens 310 to propagate along the same optical axis as the optical axis of the object light or with a predetermined angular difference between its optical axis and the optical axis of the object light. Thus, the light receiving unit 140 may sense the holographic image.

The above-described embodiments are merely examples, and it will be appreciated by one of ordinary skill in the art various changes may be made thereto without departing from the scope of the present invention. Accordingly, the embodiments set forth herein are provided for illustrative purposes, but not to limit the scope of the present invention, and should be appreciated that the scope of the present invention is not limited by the embodiments. The scope of the present invention should be construed by the following claims, and all technical spirits within equivalents thereof should be interpreted to belong to the scope of the present invention.

What is claimed is:

1. A holographic image sensor, comprising:
   a lens focusing object light incident from outside of the holographic image sensor to the holographic image sensor;
   a filter transmitting a predetermined wavelength band of light of the focused object light;
   a reference light source directly emitting reference light having the predetermined wavelength band to the light receiving unit;
   a light receiving unit receiving interference light caused by the predetermined wavelength band of light of the focused object light and the reference light to sense a holographic image; and
   a barrier rib preventing other light than the object light and the reference light from being incident on the light receiving unit,
   wherein the reference light source is attached to a position of the barrier rib such that the reference light source emits the reference light having the predetermined wavelength band directly to the light receiving unit without a separate optical structure between the reference light source and the light receiving unit.

2. The holographic image sensor of claim 1, wherein the light receiving unit includes a photodiode.

3. The holographic image sensor of claim 1, wherein the barrier rib is placed within a predetermined range from the light receiving unit.

4. The holographic image sensor of claim 1, wherein the reference light source includes a nano wire transistor.

5. A holographic image sensor, comprising:
   a lens focusing object light incident from outside of the holographic image sensor to the holographic image sensor, a reflective coating formed on an inner surface of the lens;
   a filter transmitting a predetermined wavelength band of light of the focused object light;
   a reference light source emitting reference light having the predetermined wavelength band to the lens;
   a light receiving unit receiving interference light caused by the predetermined wavelength band of light of the focused object light and the reference light to sense a holographic image; and
   a barrier rib preventing other light than the object light and the reference light from being incident on the light receiving unit,
   wherein the lens focuses the object light incident from outside of the holographic image sensor to the light receiving unit, and reflects the reference light emitted from the reference light source to be focused to the light receiving unit.

6. The holographic image sensor of claim 5, wherein the barrier rib is placed within a predetermined range from the light receiving unit.

7. The holographic image sensor of claim 5, wherein the reference light source includes a nano wire transistor.

8. The holographic image sensor of claim 5, wherein the light receiving unit includes a photodiode.

\* \* \* \* \*